(12) United States Patent
Polak

(10) Patent No.: US 9,869,744 B2
(45) Date of Patent: Jan. 16, 2018

(54) LOCATOR SELF-TEST

(71) Applicant: Metrotech Corporation, Santa Clara, CA (US)

(72) Inventor: Stevan Polak, Santa Clara, CA (US)

(73) Assignee: METROTECH CORPORATION, Santa Clara, CA (US)

( * ) Notice: Subject to any disclaimer, the term of this patent is extended or adjusted under 35 U.S.C. 154(b) by 0 days.

(21) Appl. No.: 14/625,458

(22) Filed: Feb. 18, 2015

(65) Prior Publication Data

US 2015/0234029 A1    Aug. 20, 2015

(30) Foreign Application Priority Data

Feb. 19, 2014  (GB) .................................. 1402952.4

(51) Int. Cl.
*G01R 35/00* (2006.01)
*G01R 29/08* (2006.01)

(52) U.S. Cl.
CPC ........ *G01R 35/005* (2013.01); *G01R 29/0814* (2013.01); *G01R 35/00* (2013.01)

(58) Field of Classification Search
CPC ........................... G01R 29/0814; G01R 35/00
See application file for complete search history.

(56) References Cited

U.S. PATENT DOCUMENTS

| | | |
|---|---|---|
| 5,043,666 A | 8/1991 | Tavernetti et al. |
| 5,134,369 A | 7/1992 | Lo et al. |
| 5,231,355 A | 7/1993 | Rider et al. |
| 5,627,475 A | 5/1997 | Strosser |
| 5,691,640 A * | 11/1997 | King ................. G01V 3/104 324/225 |
| 5,973,638 A | 10/1999 | Robbins et al. |
| 2003/0025646 A1 | 2/2003 | Chung et al. |

(Continued)

FOREIGN PATENT DOCUMENTS

| WO | 2013119741 A1 | 8/2013 | |
|---|---|---|---|
| WO | WO 2013119741 A1 * | 8/2013 | ............. G01V 3/107 |

OTHER PUBLICATIONS

International Search Report for PCT Application No. PCT/US2015/016434 issued by the US Searching Authority on May 29, 2015, pp. 1-2.

(Continued)

*Primary Examiner* — David M Gray
*Assistant Examiner* — Michael Harrison
(74) *Attorney, Agent, or Firm* — Haynes and Boone, LLP

(57) ABSTRACT

A detection apparatus with a self-test is presented. A detection apparatus such as a cable locator has an array of sensors in the form of ferrite antennas to detect an electromagnetic field produced by an object such as a buried cable. The signals are amplified, digitized and fed to a processing unit that outputs a detection signal to a display to indicate the detection of a cable. A programmable signal generator outputs a self-test signal via a voltage-current converter that is used to check the balance between the sensors. The self-test signal is directly coupled into each of the sensors through a wired connection and the processing unit uses the self-test signal to accurately determine the magnitude and phase balance of the sensors. The magnitude and phase data may be used to calibrate the instrument, apply data corrections or flag errors.

14 Claims, 2 Drawing Sheets

(56) References Cited

U.S. PATENT DOCUMENTS

| | | |
|---|---|---|
| 2003/0151404 A1 | 8/2003 | Lescourret |
| 2008/0054882 A1 | 3/2008 | Duke |
| 2010/0060285 A1* | 3/2010 | Pearson ................ G01V 3/081 |
| | | 324/326 |

OTHER PUBLICATIONS

Written Opinion for PCT Application No. PCT/US2015/016434 PCT/US2015/016434 issued by the US Searching Authority on May 29, 2015, pp. 1-3.

* cited by examiner

LOCATOR SELF-TEST

RELATED APPLICATIONS

The present application claims priority to Great Britain Application No. GB 14 02 952.4, filed on Feb. 19, 2014, which is herein incorporated by reference in its entirety.

BACKGROUND

1. Technical Field

This disclosure is concerned with improving the integrity and accuracy of detection apparatus, for example a cable locating instrument, which senses low frequency electromagnetic signals.

2. Discussion of Related Art

A cable locating instrument typically uses an array of sensors, arranged in a fixed geometry, to derive information about the relative direction of a buried utility. Low frequency magnetic sensors are a popular choice and work well when used in conjunction with a current source, which is connected to the utility.

A typical sensor uses a coil of wire wound on a ferrite core and is often referred to as an antenna. With such an antenna, it is possible to measure the magnetic field in one direction only or, by using a spatial array of antennas, a three-dimensional measurement is possible. Using two sensors on any single axis allows the magnetic field gradient to be measured. Using three sensors on any given axis allows the second-derivative of the magnetic field to be measured. Generally speaking using more sensors yields improved location accuracy, but this has to be set against the fact that increasing the number of sensors makes the equipment increasingly unwieldy.

It is important that the transfer functions of the antennas are well balanced between the channels. Without this balance the locator is disadvantaged for a variety of reasons:

Diminished sensitivity and accuracy of differential measurements.

Poor common mode rejection.

Poor depth accuracy.

Poor direction qualities from phase misalignment.

There are various known ways of energizing the antennas and calculating a magnitude response at a number of pre-defined frequencies. In one known system a small dipole generator known as a micro-sonde is positioned on the magnetic axis between two ferrite-cored sensors to emit an alternating magnetic field. Ideally the sonde would be positioned at the exact mid-point between the antennas and perpendicular to the magnetic axis. The sonde can be energized at a number of frequencies allowing the magnitude response from the two sensors to be compared.

This system provides an adequate self-check mechanism but nothing more. Various errors can easily be introduced:

Very small changes in relative position of the micro-sonde to the sensors will cause a significant change to the magnetic flux linkage.

If the locator is near a ferrous magnetic material (e.g. cast iron) then the entire magnetic aperture of both sensors will be distorted.

It is difficult to energize the micro-sonde without causing magnetic field spillage from the energizing windings. These may produce unwanted and ill-defined components to the resulting magnetic field.

In another known system the ferrite sensors each have an additional self-test winding inductively coupled to the main sensor winding and which is energized via a frequency programmable current source. This is an improvement to the micro-sonde system since the programmable current source can separately energize both antenna sensors through a multiplexer switch. The coupling to the antenna is a parallel winding which gives a strong flux-linkage when wound over the central part of the ferrite. This system yields two signals which can be measured: (i) the emf induced in the antenna which is energized, and (ii) a smaller emf induced in the other antenna caused by the radiated magnetic field and electro-magnetic induction in the opposite sensor. This self-test allows four measurements to be made at each frequency under test, which yields an improvement. However, drawbacks of this system are:

The additional self-test coil wound on each sensor produces additional parasitic capacitance which itself modifies the transfer function of the sensor—typically the self-resonant frequency is lowered and this is generally unhelpful.

Like the micro-sonde system, it is highly susceptible to micro movement between the sensors, e.g. expansion due to temperature.

Like the micro-sonde system it is highly susceptible to changes in the magnetic permeability close to the antennas.

In summary therefore, there are imperfections in the self-test measurements possible for both systems and as a result only the magnitude responses are calculated and compared. The standard deviation of a given sample of measurements is too high to be regarded as a high integrity check. Accordingly these systems can only be regarded as basic checks—not instrumentation quality.

To understand the accuracy requirements it is necessary to consider the geometry of a magnetic field. As an example, a 2% error in the calibration balance of top and bottom antennas in a cable locator with 35 cm separation between the antennas can be shown to result in a depth calculation error of at least 37.5%.

There are many other undesirable consequences of a poor calibration balance. The differential sensitivity (bottom-top) is compromised as is the ability to reject a signal which is common to both bottom and top since by definition there will be an unbalance proportional to the calibration error.

Therefore, there is a need to improve detection accuracy, increase detection speed and reduce hardware requirements.

SUMMARY

In accordance with some embodiments, a detection apparatus with a self-test is presented. In some embodiments, the detection apparatus can include a plurality of sensors to detect an electromagnetic field produced by an object; a processing unit to process signals from said plurality of sensors and output a detection signal based on the signals from those sensors; an indicator to indicate the detection of an object based on the detection signal; and signal generator to output a self-test signal to check the balance between the sensors, wherein the self-test signal is directly coupled into each of the sensors through a wired connection and the processing unit uses the self-test signal to determine the phase balance between the sensors.

Some embodiments of the invention also provide detection apparatus in which the signal generator is arranged to generate self-test signals spanning a range of frequencies.

Some embodiments of the invention also provide detection apparatus in which the signal generator generates self-test signals comprises a digital-to-analog converter (DAC) that is driven by the processing unit.

Some embodiment of the invention also provides detection apparatus in which the signal generator generates self-test signals with a current source.

These and other embodiments will be described in further detail below with respect to the following figures.

BRIEF DESCRIPTION OF THE DRAWINGS

The following description and the accompanying drawings referred to therein are included by way of non-limiting examples in order to illustrate how some embodiments may be put into practice.

The drawings may be better understood by reading the following detailed description.

DETAILED DESCRIPTION

Some embodiments of the present invention seek to provide a new and inventive self-test system which allows the sensors and their associated electronics to be analyzed such that the channels can be balanced to a very high precision.

Figure 1:
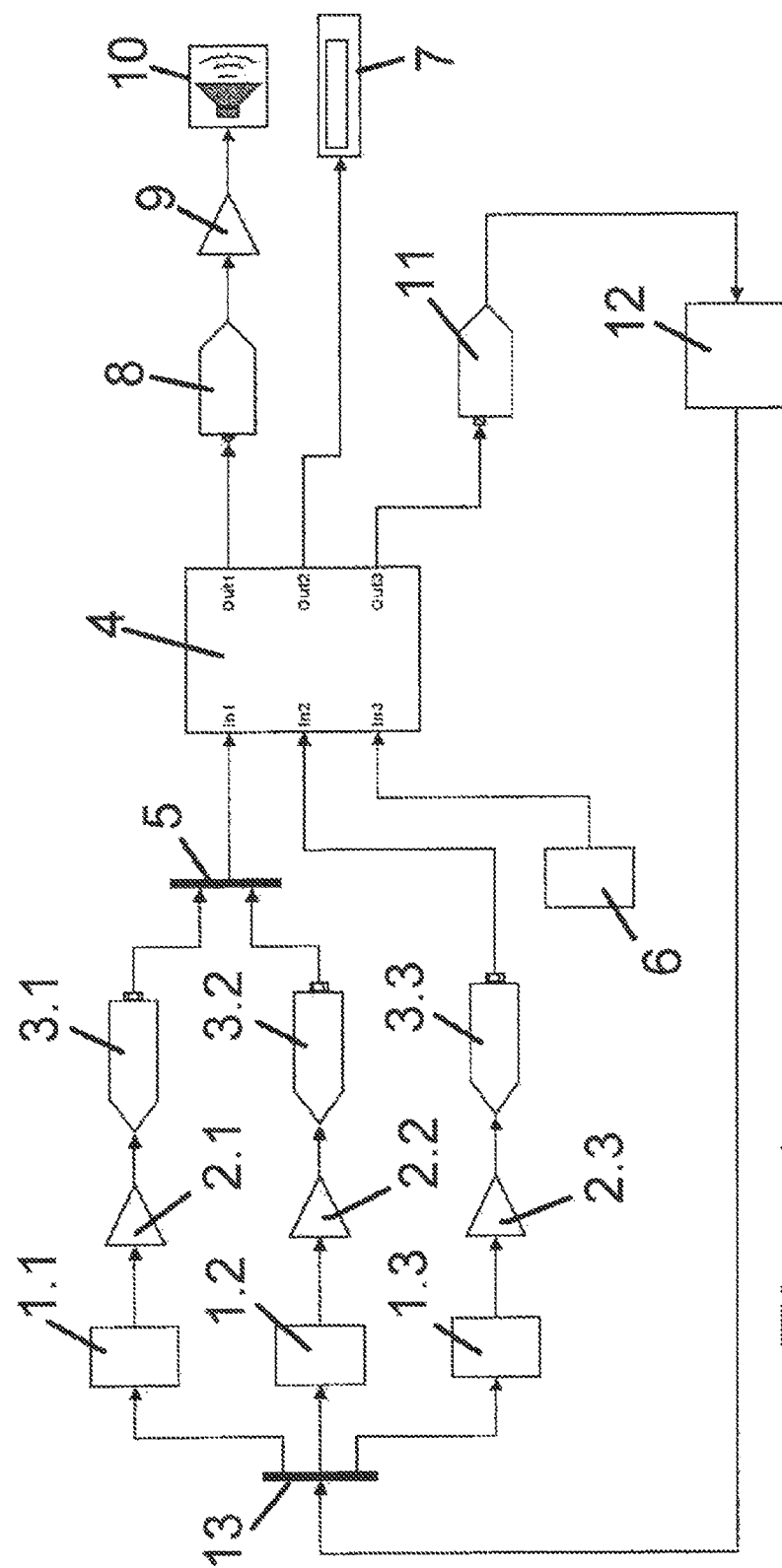
FIG. 1 is a schematic diagram of a three-channel cable locator with a self-test function in accordance with some embodiments of the invention.

Referring firstly to FIG. 1, the main components of the cable locator are shown by way of example, but it will be appreciated that detection apparatus in accordance with some embodiments of the invention may include additional features and components, for example a GPS receiver. In this example the cable locator has three magnetic sensors 1.1, 1.2 and 1.3 in the form of conventional low frequency ferrite-cored antennas designed for maximum sensitivity and low noise. The signals from the windings of the three antennas are sent to respective pre-amplifiers 2.1, 2.2 and 2.3 which (i) ensure that the sensor noise dominates the ADC quantization noise by about +6 dB, and (ii) have a transfer function which normalizes the antenna response as a function of frequency. Each antenna and pre-amplifier combination typically operates from about 10 Hz to 200 kHz.

The amplified antenna signals are fed to three analog-to-digital converter (ADC) codecs 3.1, 3.2 and 3.3, which may be 24-bit delta-sigma converters that operate at sample rates of 4 kHz<Fs<96kHz. The delta-sigma ADC provides a sharp anti-alias filter that tracks the sampling frequency at Fs/2. Each converter can have a high dynamic range and performance, typically a Signal-to-Noise-Plus-Distortion (S/(N+D) of +93 dB over a 50 kHz Bandwidth.

The digital outputs from the three ADC codecs are fed to a signal processing unit 4. Any two or more of the channels may be combined by using one or more multiplexers 5. The processing unit 4 may also receive input from a user interface 6, which may typically include keypads, gain controls and mode selection switches. The processing unit 4 operates to output a detection signal, based on the input signals derived from the three antennas, to drive a display 7. A further output from the processing unit 4 passes via one or more digital-to-analog (DAC) codecs 8 to an analogue power amplifier 9, which in turn drives a speaker or other suitable sound output device 10. The DACs 8 may again be 24-bit delta-sigma codecs.

A further DAC codec 11 (which may be another 24-bit delta-sigma codec) is driven by the processing unit 4 to generate a programmable self-test signal at various test frequencies throughout the required frequency spectrum of the apparatus. The voltage output of the DAC is converted into a stable current source by a suitable voltage-to-current converter 12—this may simply be a high stability resistor on the output of the DAC or a trans-conductance amplifier, for example. The self-test signal is directly coupled to each of the antenna windings, 1.1, 1.2 and 1.3, via a wired connection, e.g. using a multiplexer 13. The signals may be directly coupled to the "hot" end of the windings.

For applications requiring operation beyond the Nyquist frequency a superheterodyne mixer may be used (not shown) suitably positioned between the DAC 11 and the antennas.

Figure 2:
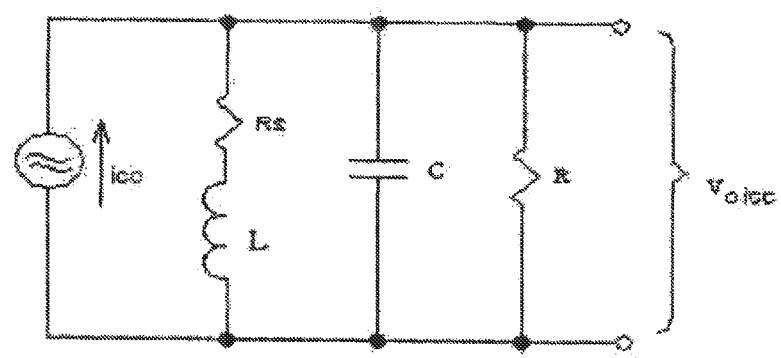
FIG. 2 is a schematic representation of a ferrite antenna of the cable locator showing an equivalent circuit thereof with a self-test signal applied directly to the antenna winding.

In embodiments of the present invention, the excitation signal is directly coupled to the sensor winding without using wireless, inductive or capacitive coupling. FIG. 2 shows a schematic representation of the antenna, which produces an output voltage Voicc from the applied current icc caused by the excitation signal from the current source. The inductor L represents the ferrite antenna and winding, Rs is the DC resistance of the winding caused by its conductivity, C is the parasitic capacitance introduced by the winding and R is a damping resistor which is chosen to ensure the system is critically damped in response to a voltage impulse. Without the damping resistor the circuit would have a high 'Q' factor at the resonant frequency and would be prone to 'ringing' (unwanted oscillations). The output voltage of the antenna system can be shown to be:

$$V_{oicc} = icc \cdot \frac{1}{\frac{1}{s \cdot L + Rs} + s \cdot C + \frac{1}{R}} =$$

$$icc \cdot \frac{R \cdot (s \cdot L + Rs)}{(R + s^2 \cdot C \cdot R \cdot L + s \cdot C \cdot R \cdot Rs + s \cdot L + Rs)}$$

where:
s=j w—the imaginary component of the Laplace Operator, and
w=2πf—the angular frequency.

Figure 3:
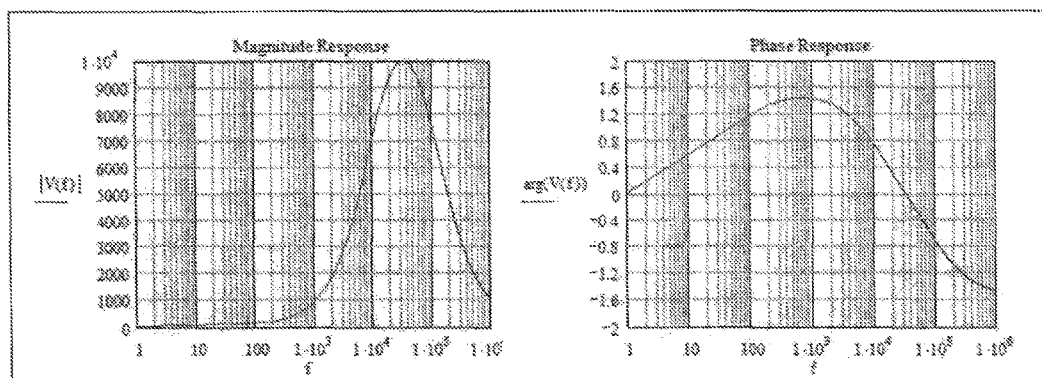
FIG. 3 shows the magnitude and phase responses of the antenna shown in FIGS. 1 and 2 plotted over frequency using a typical set of values.

FIG. 3 shows the magnitude and phase responses of the antenna plotted over frequency using a typical set of values: L=11.6 mH, R=10 kO, Rs=37O, C=150 pF. It can be shown that the coupled current source correlates well with the intrinsic response of the antenna—in other words the voltage response of an antenna placed in a magnetic field emanating from an infinite straight wire. Therefore the self-test mechanism provides a valid characterization of the transfer function for the real induced voltage.

This system architecture allows the signal processing unit to accurately calculate the magnitude and phase response of each antenna and associated electronics over the useful frequency range of the instrument, typically 10 Hz to 200 kHz. The magnitude and phase data can therefore be used to correct for changes in the antenna characteristics and/or to check the integrity of the detection system, e.g. indicating an error if the antenna characteristics fall outside acceptable operating parameters. This self-test system can also be used to calibrate the cable locators during manufacture.

In some embodiments, the self-test system is typically capable of ensuring that the calibration ratio is balanced to 1±0.002 (2 parts in 1000).

Some embodiments of the invention therefore provide a significant improvement in the fidelity and integrity of a self-test system as applied to a detector such as a cable locating instrument. By characterizing the magnitude and phase response at a number of frequencies the locator can check the balance between various antennas and confirm the product is within specification limits.

By comparing the self-test information with an original factory calibration of magnitude and phase, the instrument can measure any long term drift which may become apparent.

Some embodiments of this invention could eliminate the requirement for calibration during the manufacturing process, although it may be considered better practice to have an original factory calibration and monitor any movement over time.

The self-test system according to some embodiments offers much improved immunity to environmental parameters (proximity to metal), which limits the performance of known arrangements to basic system checking rather than precision measurement.

Whilst the above description places emphasis on the areas which are believed to be new and addresses specific problems which have been identified, it is intended that the features disclosed herein may be used in any combination which is capable of providing a new and useful advance in the art.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A detection apparatus, comprising:
    a plurality of sensors to detect an electromagnetic field produced by an object;
    a processing unit configured to:
        process signals received from the plurality of sensors;
        drive a signal generator to output a self-test signal to each of the plurality of sensors, the plurality of sensors being coupled via a wired connection to the signal generator;
        determine a phase balance between the plurality of sensors using the self-test signal; and
        output a detection signal based on the signals from the plurality of sensors; and an indicator to indicate detection of an object based on the detection signal.

2. The detection apparatus of claim 1, wherein the signal generator is arranged to generate self-test signals spanning a range of operating frequencies of the detection apparatus.

3. The detection apparatus of claim 1, wherein the signal generator comprises a digital-to-analog converter (DAC).

4. The detection apparatus of claim 1, wherein the signal generator comprises a current source.

5. The detection apparatus of claim 1, further comprising a superheterodyne mixer, the superheterodyne mixer being usable to allow the self-test signal to include frequencies beyond a Nyquist frequency of the detection apparatus.

6. The detection apparatus of claim 1, further comprising a plurality of amplifiers coupled to the plurality of sensors, the plurality of amplifiers being configured to normalize sensor responses as a function of frequency.

7. The detection apparatus of claim 1, further comprising one or more analog-to-digital converters (ADCs) coupled to the plurality of sensors and the processing unit.

8. The detection apparatus of claim 7, wherein the ADCs are delta-sigma ADCs.

9. A method, comprising:
    detecting, by one or more sensors, an electromagnetic field produced by an object;
    processing, by a signal processing unit, signals received from the one or more sensors;
    driving, by the signal processing unit, a signal generator to generate a self-test signal directly coupled into each of the one or more sensors through a wired connection, the signal processing unit using the self-test signal to determine a phase balance between the sensors; and
    outputting a detection signal based on the signals from the one or more sensors.

10. The method of claim 9, further comprising generating self-test signals spanning a range of operating frequencies of an instrument comprising the signal processing unit and the one or more sensors.

11. The method of claim 9, wherein the one or more sensors are ferrite-cored antennas.

12. The method of claim 9, further comprising measuring a long term drift of an instrument comprising the signal processing unit and the one or more sensors.

13. The method of claim 12, wherein measuring the long term drift comprises comparing information from the self-test signal to a factory calibration of magnitude and phase.

14. The method of claim 9, further comprising normalizing sensor responses as a function of frequency using a plurality of amplifiers coupled to the one or more sensors.

* * * * *